(12) United States Patent
Fleming et al.

(10) Patent No.: US 9,793,944 B2
(45) Date of Patent: *Oct. 17, 2017

(54) SYSTEM AND APPARATUS FOR DECODING TREE-BASED MESSAGES

(71) Applicant: Massachusetts Institute of Technology, Cambridge, MA (US)

(72) Inventors: Kermin Elliott Fleming, Lexington, KY (US); Peter Anthony Iannucci, Palo Alto, CA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/820,856

(22) Filed: Aug. 7, 2015

(65) Prior Publication Data

US 2017/0041041 A1 Feb. 9, 2017

Related U.S. Application Data

(63) Continuation of application No. 13/901,667, filed on May 24, 2013, now Pat. No. 9,160,399.

(60) Provisional application No. 61/789,954, filed on Mar. 15, 2013, provisional application No. 61/651,336, filed on May 24, 2012.

(51) Int. Cl.
*H04B 1/66* (2006.01)
*H04L 1/00* (2006.01)
*H03M 13/39* (2006.01)
*H04B 1/16* (2006.01)
*H04B 1/06* (2006.01)

(52) U.S. Cl.
CPC .......... *H04B 1/66* (2013.01); *H03M 13/3977* (2013.01); *H04B 1/16* (2013.01); *H04L 1/0054* (2013.01); *H04B 1/06* (2013.01)

(58) Field of Classification Search
CPC .... H04B 1/66; H04B 1/16; H04B 1/06; A01B 12/006
See application file for complete search history.

(56) References Cited

U.S. PATENT DOCUMENTS

| 5,903,549 | A | 5/1999 | von der Embse et al. |
| 6,029,264 | A | 2/2000 | Kobayashi et al. |
| 6,154,541 | A | 11/2000 | Zhang |
| 6,765,507 | B2 | 7/2004 | Yokokawa et al. |

(Continued)

OTHER PUBLICATIONS

Final Office Action dated Aug. 18, 2015 for U.S. Appl. No. 14/314,347; 19 pages.

(Continued)

*Primary Examiner* — Janice Tieu
(74) *Attorney, Agent, or Firm* — Daly, Crowley, Mofford & Durkee, LLP

(57) ABSTRACT

A system and techniques for decoding a message received over a communication channel comprises a receiver for receiving an encoded message. A sorting module is configured to organize candidate messages into a number of bins, sort the candidate messages within each bin, and output a group of candidate messages, the group comprising a number of most likely candidate messages from each message bin. A traceback module is configured to receive the most likely candidate message, and to walk through the tree of candidate messages to generate a decoded message.

28 Claims, 7 Drawing Sheets

(56) References Cited

U.S. PATENT DOCUMENTS

| | | | |
|---|---|---|---|
| 7,206,364 | B2 | 4/2007 | Miller |
| 7,239,667 | B2 | 7/2007 | Shen et al. |
| 7,318,185 | B2 | 1/2008 | Khandani et al. |
| 7,372,802 | B2 | 5/2008 | Breiling et al. |
| 7,457,411 | B2 | 11/2008 | Soliman |
| 7,487,355 | B2 | 2/2009 | Pelly et al. |
| 7,564,775 | B2 | 7/2009 | Jayaraman et al. |
| 7,627,056 | B1 | 12/2009 | Harris et al. |
| 7,711,066 | B2 | 5/2010 | Jiang et al. |
| 7,865,799 | B2 | 1/2011 | Sawaguchi |
| 7,954,016 | B2 | 5/2011 | Pan et al. |
| 7,957,482 | B2 | 6/2011 | Golitschek Edler Von Elbwart et al. |
| 7,986,752 | B2 | 7/2011 | Nikopour-Deilami et al. |
| 8,040,981 | B2 | 10/2011 | Amiri |
| 8,090,049 | B2 | 1/2012 | Kent et al. |
| 8,209,580 | B1 | 6/2012 | Varnica et al. |
| 8,261,079 | B2 | 9/2012 | Newman et al. |
| 8,315,325 | B2 | 11/2012 | Lee et al. |
| 8,385,445 | B2 | 2/2013 | Vitale et al. |
| 8,468,396 | B2 | 6/2013 | Wu et al. |
| 8,503,552 | B2 | 8/2013 | Pfletschinger |
| 8,537,787 | B2 | 9/2013 | Qu et al. |
| 8,537,919 | B2 | 9/2013 | Fonseka et al. |
| 8,559,543 | B1 * | 10/2013 | Lee .................. H04B 7/0413 375/267 |
| 8,599,946 | B2 | 12/2013 | Kim et al. |
| 8,683,274 | B1 | 3/2014 | Varnica et al. |
| 8,693,559 | B2 | 4/2014 | Shaw et al. |
| 8,724,715 | B2 | 5/2014 | Perry et al. |
| 8,761,318 | B2 | 6/2014 | Drumm et al. |
| 8,792,325 | B1 | 7/2014 | Narasimhan |
| 8,797,972 | B2 | 8/2014 | Kwon et al. |
| 8,798,201 | B2 | 8/2014 | Kim |
| 8,799,735 | B2 | 8/2014 | Wu et al. |
| 8,811,509 | B2 | 8/2014 | Shen et al. |
| 8,848,842 | B2 | 9/2014 | Dick |
| 8,891,763 | B2 | 11/2014 | Tomlinson et al. |
| 8,948,100 | B2 | 2/2015 | Jeong et al. |
| 2001/0033621 | A1 | 10/2001 | Khayrallah |
| 2002/0056064 | A1 | 5/2002 | Kidorf et al. |
| 2003/0138055 | A1 | 7/2003 | Saito et al. |
| 2005/0135498 | A1 | 6/2005 | Yee |
| 2006/0048038 | A1 | 3/2006 | Yedidia et al. |
| 2006/0153312 | A1 | 7/2006 | Yun et al. |
| 2006/0205357 | A1 | 9/2006 | Kim |
| 2007/0149242 | A1 | 6/2007 | Kim et al. |
| 2008/0165878 | A1 * | 7/2008 | Kajihara .................. H04L 1/06 375/264 |
| 2008/0233966 | A1 | 9/2008 | Scheim et al. |
| 2008/0260053 | A1 | 10/2008 | Yun et al. |
| 2009/0199069 | A1 | 8/2009 | Palanki et al. |
| 2009/0257530 | A1 | 10/2009 | Shim |
| 2010/0067614 | A1 | 3/2010 | Koslov et al. |
| 2010/0100792 | A1 | 4/2010 | Abu-Surra |
| 2010/0153270 | A1 | 6/2010 | Hawkes |
| 2011/0299629 | A1 | 12/2011 | Luby et al. |
| 2012/0063429 | A1 | 3/2012 | Yang et al. |
| 2012/0106684 | A1 | 5/2012 | Eckert |
| 2013/0099901 | A1 | 4/2013 | Jones et al. |
| 2013/0145239 | A1 | 6/2013 | Pi et al. |
| 2013/0259149 | A1 | 10/2013 | Dhakal et al. |
| 2013/0326630 | A1 | 12/2013 | Argon |
| 2014/0072076 | A1 | 3/2014 | Taherzadehboroujeni et al. |
| 2014/0136584 | A1 | 5/2014 | Schumacher |
| 2014/0169492 | A1 | 6/2014 | Mahdavifar et al. |
| 2014/0205036 | A1 | 7/2014 | Kim |
| 2014/0211881 | A1 | 7/2014 | Perry et al. |
| 2014/0247910 | A1 | 9/2014 | Drumm et al. |
| 2014/0334421 | A1 | 11/2014 | Sosa et al. |
| 2014/0369434 | A1 | 12/2014 | Taherzadehboroujeni et al. |
| 2015/0003557 | A1 | 1/2015 | Perry et al. |
| 2015/0016577 | A1 | 1/2015 | Varadaharajan et al. |
| 2015/0143446 | A1 | 5/2015 | Lee et al. |
| 2015/0180509 | A9 | 6/2015 | Fonseka et al. |

OTHER PUBLICATIONS

Notice of Allowance dated Oct. 21, 2015; For U.S. Appl. No. 14/314,347; 9 pages.

Response filed on Oct. 2, 2015 to Final Office Action dated Aug. 18, 2015; for U.S. Appl. No. 14/314,347; 17 pages.

U.S. Appl. No. 14/230,165, filed Mar. 31, 2014, Perry et al.

U.S. Appl. No. 14/314,347, filed Jun. 25, 2014, Perry et al.

Bahl et al.; "Optimal Decoding of Linear Codes for Minimizing Symbol Error Rate;" IEEE Transactions on Information Theory; Mar. 1974; pp. 284-287.

Berrou et al.; "Near Shannon Limit Error—Correcting Coding and Decoding: Turbo-Codes (1);" IEEE International Conference on Communication; May 1993; pp. 164-170.

Cheng et al.; "A 0.077 to 0.168 nJ/bit/iteration Scalable 3GPP LTE Turbo Decoder with an Adaptive Sub-Block Parallel Scheme and an Embedded DVFS Engine;" Massachusetts Institute of Technology, Dept. of Electrical Engineers and Computer Science; Sep. 2010; 5 sheets.

Cypher et al.; "Generalized Trace-Back Techniques for Survivor Memory Management in the Viterbi Algorithm;" Journal of Very Large Scale Integration Signal Processing Systems, vol. 5, Issue 1; Jan. 1993; pp. 85-94.

Forney, Jr.; "The Viterbi Algorithm;" Proceedings of the IEEE, vol. 61, No. 3; Mar. 1973; pp. 268-278.

Lin et al.; "A 1000-Word Vocabulary, Speaker-Independent, Continuous Live-Mode Speech Recognizer Implemented in a Single FPGA;" Proceedings of the 2007 AMC/SIGDA 15$^{th}$ International Symposium on Field Programmable Gate Arrays; Jan. 2007; 9 pages.

Ng et al.; "From WiFi to WiMAX: Techniques for High-Level IP Reuse Across Different OFDM Protocols;" IEEE/ACM International Conference on Formal Methods and Models for Codesign; May 2007; 10 sheets.

Paaske; "An Area-Efficient Path Memory Structure for VLSI Implementation of High Speed Viterbi Decoders;" Integration, the Very Large Scale Integration Journal, vol. 12, No. 2; Jan. 1991; pp. 79-91.

Perez et al.; "VLSI Architecture for the M Algorithm Suited for Detection and Source Coding Applications;" IEEE Proceedings of the 14$^{th}$ International Conference on Electronics, Communications and Computers; Jan. 2005; 6 sheets.

Perry et al.; Spinal Codes; Special Interest Group on Communications'12; Aug. 2012; pp. 49-60.

Power et al.; "Reduced Complexity Path Selection Networks for M-Algorithm Read Channel Detectors;" IEEE Transactions on Circuits and Systems—I: Regular Papers, vol. 55, No, 9; Oct. 2008; pp. 2924-2933.

PCT Partial Search Report of the ISA dated May 31, 2012; for PCT Pat. App. No. PCT/US2012-025612.

PCT Search Report and Written Opinion of the ISA dated Jul. 27, 2012; for PCT Pat. App. No. PCT/US2012/025612.

PCT International Preliminary Report on Patentability and Written Opinion dated Aug. 29. 2013 for PCT Pat. Appl. No. PCT/US2012/025612.

U.S. Appl. No. 11/619,675.

U.S. Appl. No. 12/629,374.

Restriction Requirement dated Dec. 3, 2014 corresponding to U.S. Appl. No. 14/230,165; 11 Pages.

Response to Restriction Requirement dated Dec. 3, 2014 corresponding to U.S. Appl. No. 14/230,165; Response Filed on Dec. 29. 2014; 1 Page.

Office Action dated Feb. 18, 2015 corresponding to U.S. Appl. No. 14/230,165; 9 Pages.

Office Action dated Mar. 6, 2015; for U.S. Appl. No. 14/314,347; 21 pages.

Response flied on May 14, 2015 to Non-Final Office Action dated Feb. 18, 2015; for U.S. Appl. No. 14/230,165; 11 pages.

Response filed on Jun. 4, 2015; to an Office Action dated Mar. 6, 2015; for U.S. Appl. No. 14/314,347; 14 pages.

Notice of Allowance dated May 26, 2015; for U.S. Appl. No. 14/230,165; 11 pages.

Non-Final Office Action dated Jul. 31, 2014; for U.S. Appl. No. 13/901,667; 9 pages.

(56) References Cited

OTHER PUBLICATIONS

Response filed on Nov. 19, 2014 to Non-Final Office Action dated Jul. 31, 2014; for U.S. Appl. No. 13/901,667; 31 pages.
Final Office Action dated Feb. 4, 2015; for U.S. Appl. No. 13/901,667; 12 pages.
Response filed on Jun. 2, 2015 to Final Office Action dated Feb. 4, 2015; for U.S Appl. No. 13/901,667; 17 pages.
Notice of Allowance dated Jun. 10, 2015; for U.S. Appl. No. 13/901,667; 9 pages.

* cited by examiner

SYSTEM AND APPARATUS FOR DECODING TREE-BASED MESSAGES

CROSS-REFERENCE TO RELATED APPLICATIONS

This application is a CONTINUATION of U.S. patent application Ser. No. 13/901,667, filed May 24, 2013, which is incorporated by reference here in its entirety.

This application also claims the benefit under 35 U.S.C. §119(e) of U.S. Provisional Application No. 61/651,336, filed May 24, 2012, titled SPINAL DECODER, and of U.S. Provisional Application No. 61/789,954, filed Mar. 15, 2013, titled HARDWARE IMPLEMENTATION FOR DECODER which are incorporated here by reference in their entirety.

STATEMENTS REGARDING FEDERALLY SPONSORED RESEARCH

Not Applicable

FIELD

The concepts, systems and techniques described herein relate to decoding digital data for reliable transmission over communication channels and more particularly to decoding of the tree-based messages.

BACKGROUND

As it is known in the art, transmissions in noisy systems are often encoded into a sequence of symbols in such a manner that the message can be recovered from the symbols even when received in the presence of noise or other impairments. Examples of such systems include artificial systems like cell phone networks, and natural systems, such as human speech. When received, these encoded messages must be decoded by the receiving device. Many encoding schemes employ error detection and correction to increase reliability and accuracy of the received messages. Some decoding schemes make use of a tree data structure (or simply a "tree") containing all possible decoded messages for each received transmission. In such a tree, each path from the root node to an edge (i.e. leaf node) of the tree represents a potential message. However, if the tree of all possible messages is large, it may be expensive to implement a decoder in hardware because of the large amount of circuitry required. Also, given fast data rates for transmissions, the decoding process for some tree-based decoding schemes may take a prohibitively long time to complete.

SUMMARY

In accordance with the concepts, systems and techniques described herein, a system for decoding digital data for reliable transmission over noisy or otherwise unreliable communication channel includes a receiver capable of receiving an encoded message, a sorting module configured to organize candidate messages into a number of bins, sort the candidate messages within each bin, and output a group of candidate messages, the group comprising a number of most likely candidate messages from each message bin; and a traceback module configured to receive the most likely candidate messages, and walk through the a tree of candidate messages to generate a decoded message.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Figure 1:
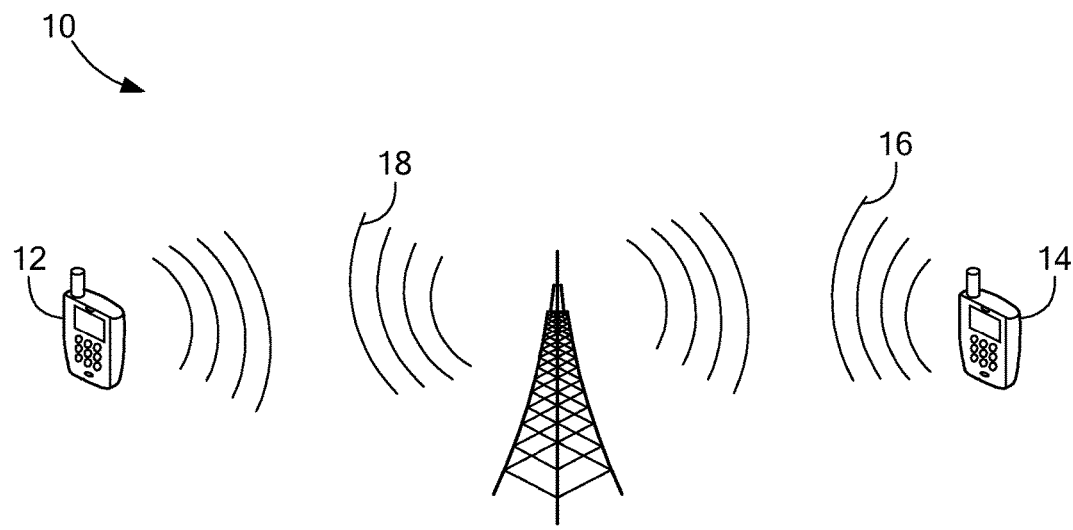
FIG. 1 is a diagram of a wireless transmission system.

Before describing an encoding system and techniques associate therewith, some introductory concepts and terminology are explained.

Noisy systems, those in which an original message is perturbed by some physical phenomenon, are often decoded using a directed graph representation. This graph could be a tree, or it could have a more complex trellis structure. Paths in the tree represent potential messages. Edges in the tree relate prefixes of potential messages. In choosing the most likely original message, the decoder explores portions of the tree to find the most likely original message.

Reference is sometimes made to an "original message" or more simply a "message," The message may be represented as a "sequence" or "stream" of digital bits which, may also be referred to as a "digital signal." The "original message" may refer to the message (i.e. sequence of data) originally sent by a transmitter. The term "original message" typically refers to the message prior the message being encoded, but may also refer to the message after it has been encoded. In some cases, an analog or continuous parameter signal can be converted into a digital signal using known analog-to-digital conversion techniques. In this case, the values of the bits in the bit stream are selected such that the digital signal is a close representation of the analog or continuous parameter signal (within a selected error metric). The digital data values may be stored in a digital data storage device, such as a memory for example, as an array of numbers representing the message, etc.

Reference is sometimes made to a "candidate message" or a "candidate." A candidate message is a sequence of data that may be the same as the original message. For example, during decoding of the original message, a decoder may not know the data sequence of the original message. Therefore, the decoder may be presented with multiple data sequences (i.e. candidate messages), each one of which could be the original message. Alternatively, a candidate message may refer to the data stored in a node of a tree structure. Candidate message may also refer to the data stored in a node and its parent nodes within a tree structure.

Reference is sometimes made to a "best candidate message(or more simply a "best candidate")". A "best candidate message" is a candidate message deemed, (or selected) from among one or more candidate messages most likely to be the same an original message during decoding operations. Since a decoder may not know which candidate message is the same as the original message, there may be more than one best candidate message at different points in time throughout a decoding process. Therefore, the decoding process may comprise choosing the best candidate message or messages, i.e. the candidate messages that are most likely the same as the original message.

Reference is sometimes made to a "symbol." A symbol is a sequence of data comprising all or part of a message.

Reference is sometimes made to a "tree." A tree is a hierarchical data structure having nodes and connections between nodes. Each node in the tree represents a data structure at least one value and a list of references to other nodes ("child" nodes). The node that references a child node is sometimes referred to herein as a "parent" node. Nodes that have the same parent are sometimes referred to herein as "sibling" nodes. Nodes at the same hierarchical level within the tree (e.g. sibling and cousin nodes) are sometimes collectively referred to herein as a "generation."

Reference is sometimes made to a "search space" or a "tree search space." A search space is an amount of data to be searched in order to identify candidate messages. In some embodiments, the search space is the data to be searched in order to identify the best candidate message. A tree search space is an amount of data, based on a tree data structure, to be searched. Although "tree search space" is sometimes used herein, one skilled in the art will recognize that a "search space" may comprise, but is not limited to, a "tree search space."

Referring now to FIG. 1, wireless communication system 10 includes a transceiver 12 and a transceiver 14. Transceivers 12 and 14 are capable of sending and receiving messages through wireless networks 16 and 18. Wireless networks 16 and 18 may include any number of repeaters, routers, broadcast towers, or other devices to receive network traffic from its source and direct network traffic to its intended recipient devices. In an embodiment, transceivers 12 and 14 may include encoders to encode the original message prior to transmission, and decoders to decode messages once they are received. The encoding and decoding mechanisms may, in an embodiment, be rate-less codes that may include error correction and/or compression. For example, the encoders and decoders may comprise spinal encoders and decoders as described, for example, in U.S. Provisional Application No. 61/651,336, which is incorporated here by reference in its entirety. In an embodiment, transceivers 12 and 14 may be cell phones, tablets, computers, or any other equipment capable of sending and receiving messages over a network.

Figure 2:
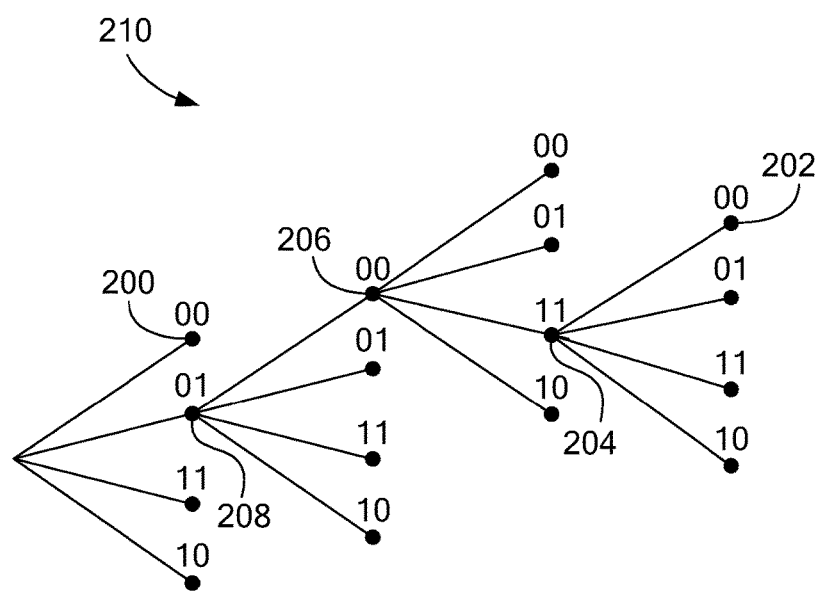
FIG. 2 is a diagram of a tree data structure for decoding an encoded message.

FIG. 2 shows an example of a tree-based decoding scheme. In such a scheme, each node in a tree 210 represents a data sequence or "message." For example, the node 200 may represent the message "00." A sequence of parent/child nodes can be used to construct a longer message. For example, starting with node 202, a message can be constructed by "walking up" the tree though parent nodes 204, 206, and 208 and combining together the message contained in each parent node 202, 204, 206, 208. If the message constructed by appending messages from each node, then the message constructed from nodes 202 (having data 00), 204 (having data 11), 206 (having data 00), and 208 (having data 01) may be: "00 11 00 01." The message can also be combined together using other techniques. For example, the messages can be constructed by prepending data from parent nodes in the tree. Messages may also be constructed by partially walking through tree 210. For example, in an embodiment, the system will construct a partial message by walking through one or more generations, but not all generations, of parent nodes within tree 210. The result of the partial walkback may comprise an output of the system. In subsequent iterations, the system will perform another partial walkback and output the result. By performing a sequence of partial walkbacks and outputting the result, the system can construct an entire message.

In an embodiment, if tree 210 were expanded to its full size, tree 210 may include all possible original messages. For example, if an encoded message having X bits is received, tree 210 may be constructed so that every possible original message can be constructed from the tree structure. In such an embodiment, each tree node, including some or all of its parent nodes, may be considered a candidate message. The decoder may then operate to weed out tree paths that are less likely to be the original message and retain tree paths that are more likely to be the original message. The decoder may, in an embodiment, operate to determine a best candidate message—i.e. a candidate message with the highest likelihood of being the original message.

In an embodiment, the decoder may determine which candidate messages have a high likelihood of being the original message by comparing the received message with expected values.

Figure 3:
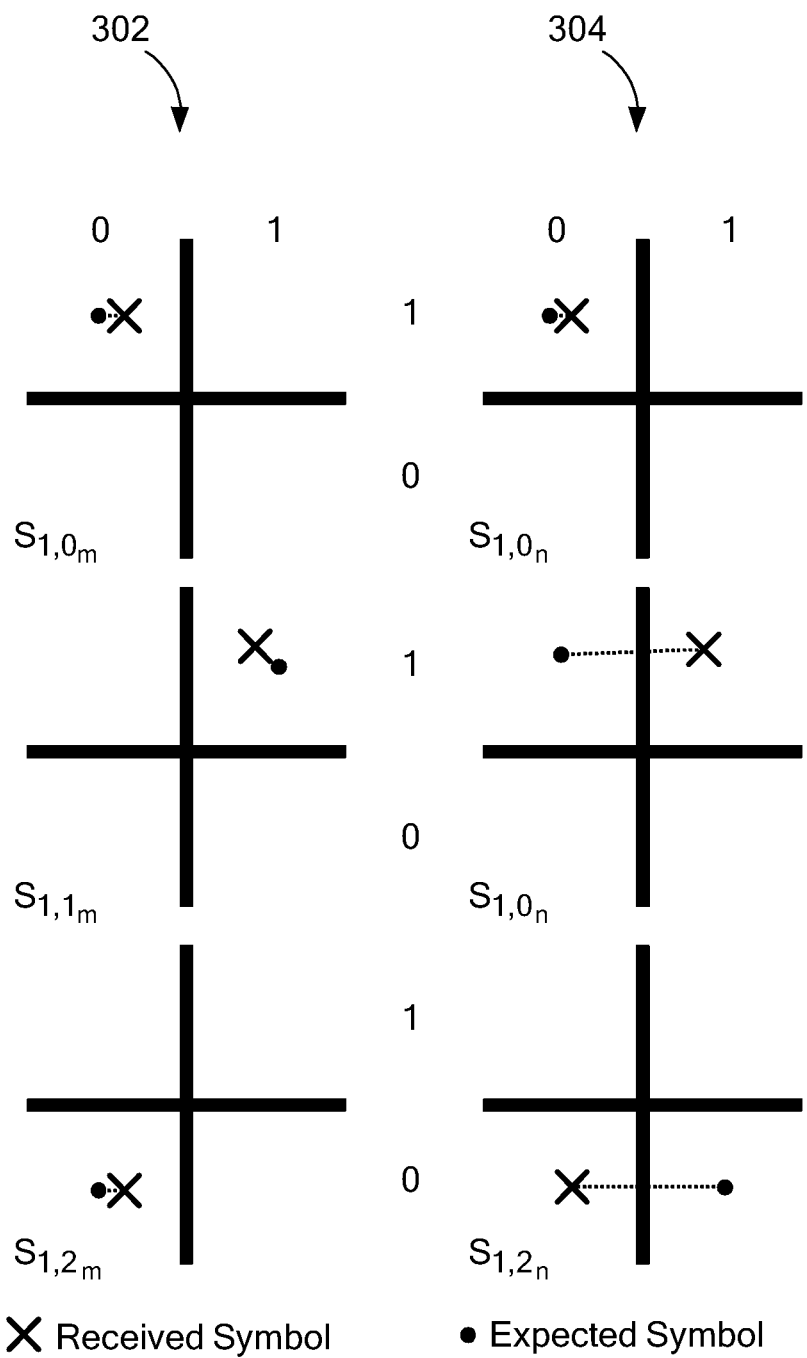
FIG. 3 is a diagram of a received message compared to two candidate messages.

Referring to FIG. 3, received symbols are shown with an X and expected symbols are shown with a dot. The expected symbols may be viewed as candidate messages within tree 210. For example, the expected symbols in column 302 and 304 may represent candidate messages or nodes in tree 210.

As shown, the received symbols in column 302 are relatively close to the expected symbols. However, the received symbols in column 304 are more distant from the expected symbols. Thus in this particular example, the candidate message in column 302 may be a better candidate than 304 because the expected symbols are closer to the received symbols.

A decoder may use various mathematical techniques known in the art to assign a value to the "distance" between the received symbol and the expected symbol or between sequences of related symbols. The decoder may then use this value to sort the expected symbols (i.e. the candidate messages) according to which is the closest. In some embodiments, expected symbols that have shorter distances to the received message may be considered better candidates than expected symbols that have greater distances to the received message. Other metrics may of course also be used to evaluate a candidate message.

In general, distance or difference between the received message and the candidate messages is used. In some systems (e.g. speech reception systems) a spectrum/feature difference measure may be used that can determine a distance or closeness between the received message and the candidate messages.

If tree 210 is large and/or the messages are long, it may require a large amount hardware or software resources to retain all the nodes in tree 210 and/or to sort the candidate messages to find a best candidate message. Accordingly, various techniques may be used to reduce the amount of resources required.

Figure 4:
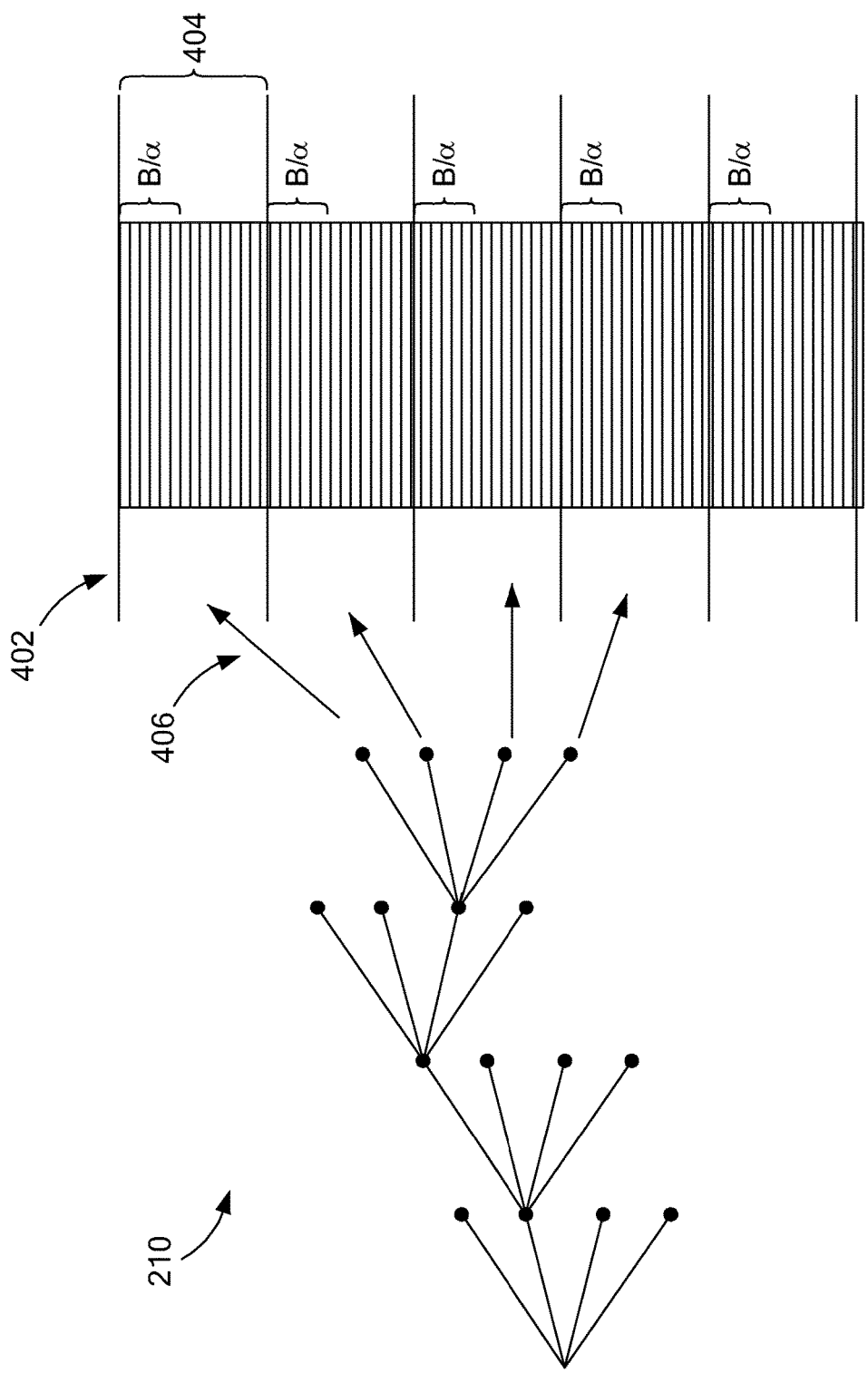
FIG. 4 is a diagram of a memory for sorting candidate messages.

FIG. 4 depicts a memory 410 that may be used to retain candidate messages. The memory 410 may be volatile or non-volatile, and may be any type of memory that can be read from or written to. For example, memory 410 may be a RAM, a FLASH, a set of registers, etc.

In an embodiment, the decoder may retain B nodes in memory at a given time and at a given generation in the tree 210. These B nodes will have $B*2^k$ child nodes, where k is the number of bits in the message being decoded. At each generation, the decoder may sort the B*2^k nodes to find the B nodes that are the best (e.g. most likely) candidates. The decoder may then discard those B*(2^k−1) nodes that received lower scores than the B best candidates. However, this sorting process may require a large amount of time and/or computing resources.

To reduce the amount of resources required, memory 410 may be segmented into separate bins 404 or sections of memory. Although memory locations within the bins 404 are shown as congruous, this is not a requirement. In an embodiment, memory 410 may be segmented into α bins so that each of the α bins contains β*2^k candidates of which β most likely candidates are selected, where β=B/α. Instead of sorting the entire list of B*2^k candidate messages, the decoder may sort each bin. After the sort is performed, each of the α bins 404 may contain a sorted list of β candidate messages. The best candidates from each bin 404 may then be selected to proceed, and the other candidates from each bin 404 may be discarded. In an embodiment, the best B/α candidates from each bin 404 are selected, as shown in FIG. 4, while the remaining candidate from each bin 404 are discarded. However, any number of best candidates from each bin 404 may be selected, according to design. In embodiments, not all bins are active at the same time. For example, some bins may be stored in registers or other memory until they are used at a later time.

To further improve the efficiency of the sorting, sibling candidates from tree 210 may be placed into different bins (as shown by arrows 406). This will allow the best candidates to be sorted within each bin 404. For example, if a parent node is a good candidate, then its child nodes may also be good candidates. If these good child candidates are placed in separate bins, they will not compete with each other during the sorting process, so that each of the good sibling candidates will be able to rise to the top of the sorted list to be propagated to the next step of the decoding process.

In an embodiment separate threads, processors, pipelines, or pipeline stages may be used to sort each bin 404. In some embodiments, each bin 404 may be sorted at the same time, i.e. in parallel, so that sorting of each bin 404 is completed at the same time. In other embodiments, the bins 404 may be sorted in a pipelined manner so that the sorting processes are completed in successive hardware or software cycles.

Figure 5:
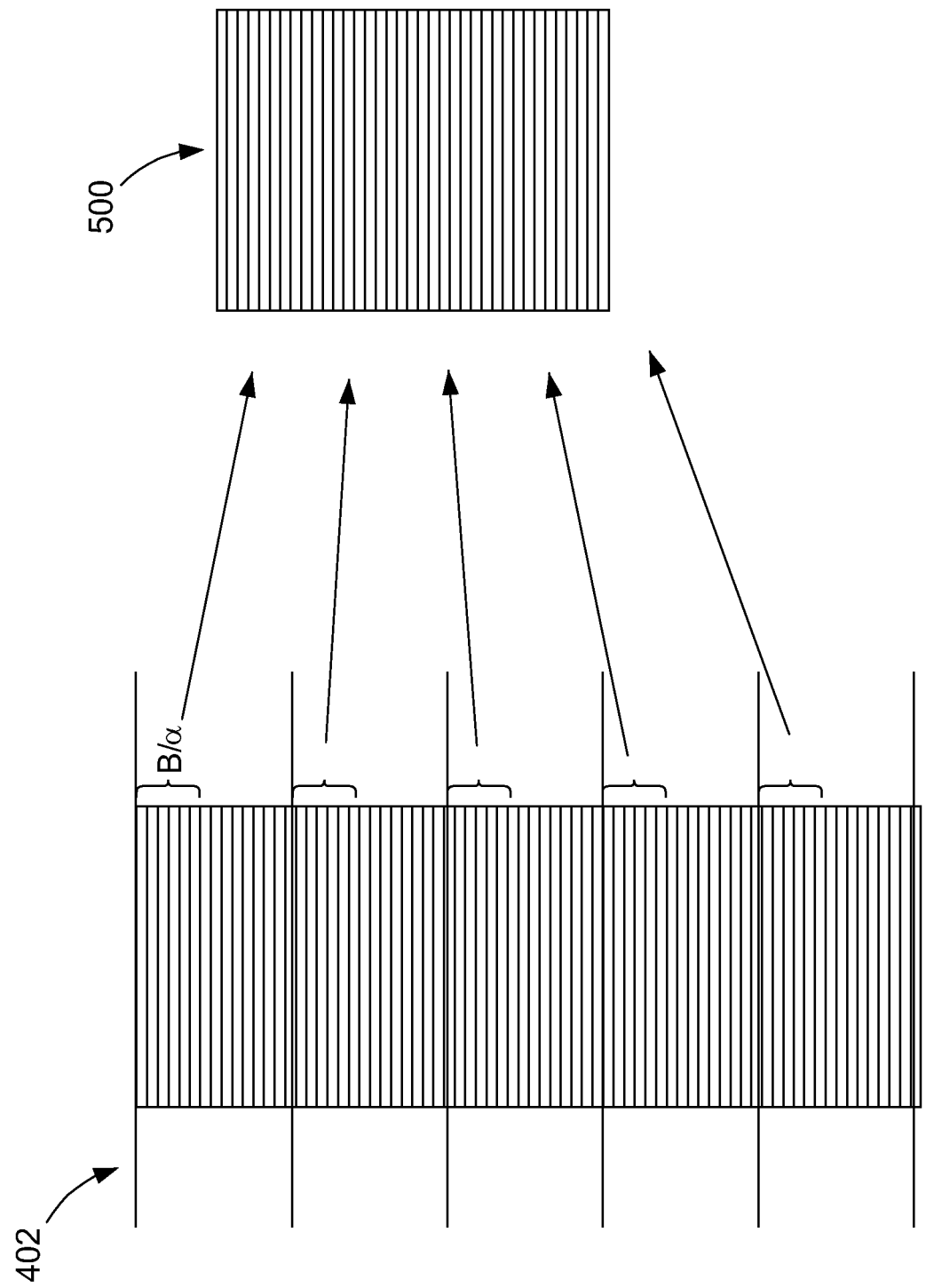
FIG. 5 is a diagram of a memory for sorting candidate messages and a list of sorted messages.

Once the sorting of each bin 404 is complete, the best candidates from each bin may be retained and added to a list 500 of best candidates, as shown in FIG. 5.

Figure 6:
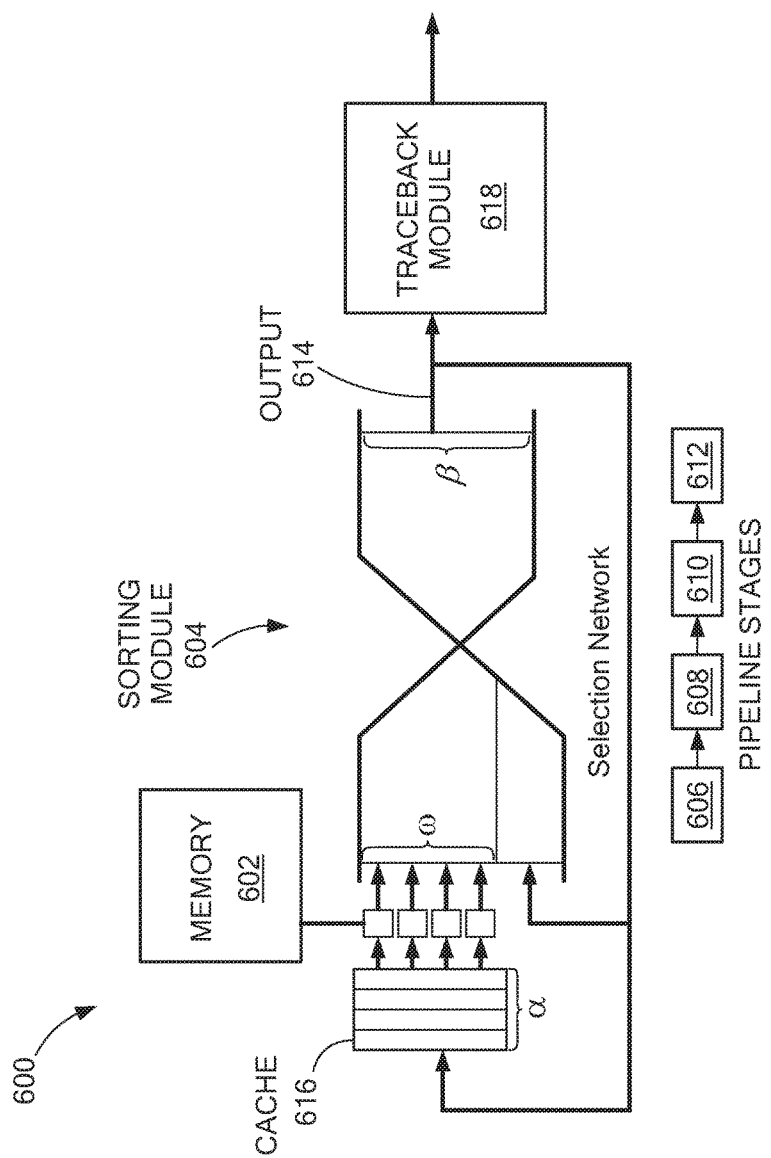
FIG. 6 is a block diagram of a decoder.

Turning to FIG. 6, a block diagram of a decoder 600 is shown. The decoder 600 includes a memory 602 for receiving candidate messages. In an embodiment, memory 602 may include candidate messages that have been sorted as described above.

Decoder 600 also includes a sorting module 604 and a traceback module 618. The sorting module operates to sort candidate message to identify best candidate messages. The sorting module 604 may be a pipelined sorting module, as indicated by blocks 606-612. Each block 606-612 represents a pipeline stage of the sorting module 604. For example, pipeline stage 606 may perform a first sort algorithm, stage 608 may perform a second sort algorithm, stage 610 may perform a third sort algorithm, and stage 612 may perform a fourth sort algorithm. In one exemplary embodiment, each stage 606-612 performs a partial sort. In such an embodiment, the list of candidate messages is completely sorted when it exits stage 612, and is partially sorted when it exits each of the other stages.

In an embodiment, some or all of the pipelined sorting stages 606-612 can be turned off so they do not operate. When some of the pipelined sorting stages are turned off, the list of candidate messages exiting stage 612 may be partially, rather than completely sorted because not all the sort operations were performed. As will be discussed below, it may be advantageous to perform a partial sort rather than a full sort in some circumstances. Turning pipeline stages off may conserve power and increase the speed of the sorting process, which may be beneficial in certain applications like cell phones, tablets, laptops, and other battery powered devices, for example.

A partial sort may also be achieved by sorting fewer than B candidates of the candidate messages. For example, the system can sort a subset of the B candidates to reduce sorting requirements.

In an embodiment, the output 614 of the sorting module 604 may be a list of β candidate messages (e.g. list 500 in FIG. 5, after being sorted). These β candidate messages are either be fed back to the sort module 604 (if the sort operation is complete) or fed back to the cache 616 (if the sort operation is not yet complete).

The cache 616 may have a width of a and act as a delay buffer or shift register so that candidate messages entering the cache 616 will exit the cache 616 after a clock cycles. The delay may also be managed via flow control and/or backpressure techniques. As the β candidate messages exit cache 616, they may be combined with W new candidate messages from memory 602. These β+W candidate messages are subsequently sorted by the sorting module 604. At the end of stage 612, the best β candidates are retained and the remaining W candidates are discarded.

After the pipelined sorting module 612 has executed (B*2^k)/W iterations of the sorting process, there may remain a sorted lists having β candidate messages each. These lists can be fed into traceback module 604. As noted above, the number of candidates sorted in the sorting process can vary dynamically during the decoding process so that the number of candidates comprising the output of sorting module 612 may be less than B candidates.

Figure 7:
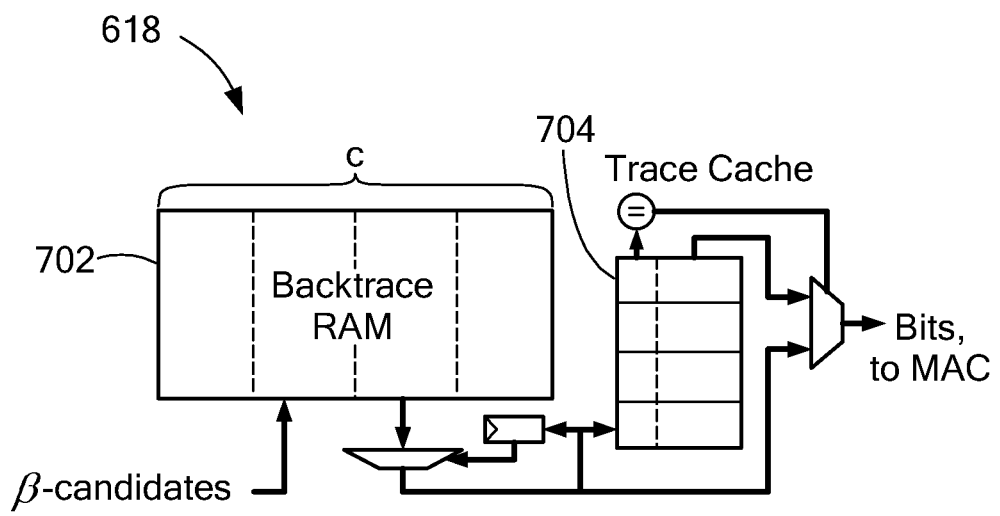
FIG. 7 is a block diagram of a traceback module.

Referring now to FIG. 7, a traceback module 604 includes backtrace RAM 702 and a trace cache 704. The traceback module 604 may receive the most likely candidate message and trace back (i.e. walk back up or recurse tree 210) to reconstruct the entire message.

In applications having long messages, the traceback process may require large amounts of memory and time. For example, given a most likely candidate, a typical traceback module may read the parent from memory, receive the parent's value, then read the grandparent from memory, then read the grandparent's value, etc. This requires a memory that can hold many parent candidate messages. Also, because reading RAM takes time (often multiple clock cycles), typical traceback modules may be slow.

To facilitate the traceback process, traceback module 604 may perform a windowed traceback. A windowed traceback may be a short traceback that is performed on a portion of tree 210 rather than tracing all the way back to the root node. For example, instead of tracing back the entire tree 210, traceback module 604 may receive perform a short traceback of one or more generations at each generation of the tree 210. The results of the short traceback, i.e. the value of the parent candidate messages, may be stored in traceback cache 704.

Figure 8:
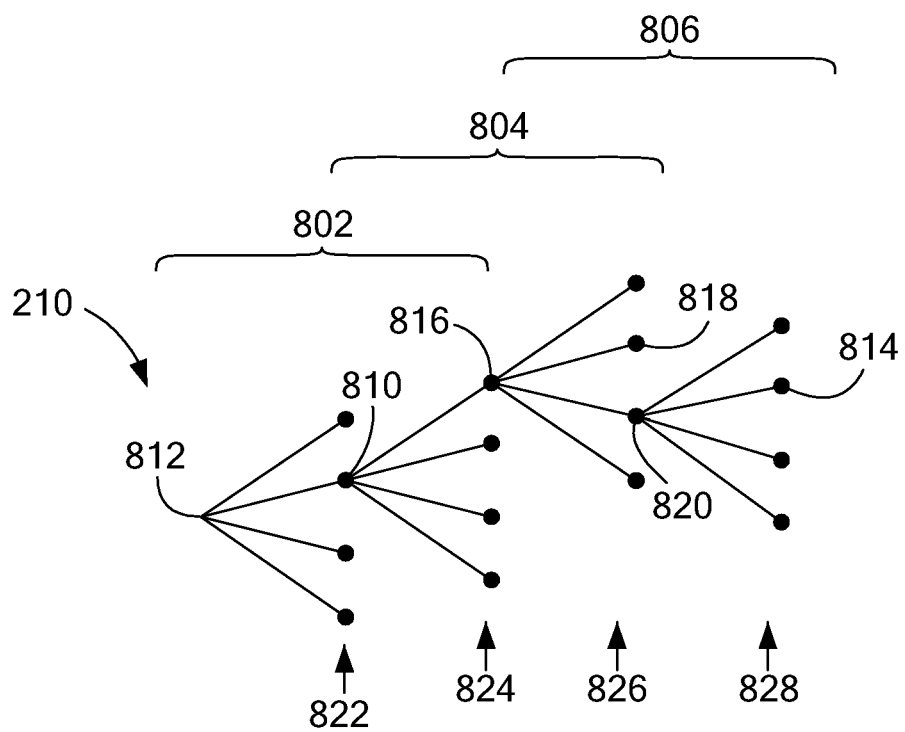
FIG. 8 is a diagram illustrating windowed traceback through a traceback module.

Referring to FIG. 8, tree 210 is shown with brackets 802, 804, and 806 representing traceback windows. During the traceback operation, traceback module 618 performs a traceback of the latest window of candidate messages. For example, during processing of a particular generation of tree 210, instead of tracing back the entire tree 210, traceback module 618 may traceback one or more generations of tree 210 and store the values of the traceback (i.e. the values stored in the nodes that were traced back from a particular child node) in traceback cache 704.

To illustrate the operation, assume that candidate message 810 in generation 822 is determined (e.g., by sorting module 604 in FIG. 6) to be the best candidate message. Traceback module 618 (FIG. 6) may recurse the tree to find parent candidate message 812, and may then store the values, i.e. the data contained in candidate messages 810 and 812, in traceback cache 704.

Assume also that when generation 824 is processed by the decoder, that candidate message 816 is determined to be the best candidate message of generation 824. Traceback module may begin to recurse tree 210 starting from candidate message 816. Because candidate message 810 is the parent of candidate message 816, and because the value of candidate message 810 (and grandparent message 812) are stored in traceback cache 704, traceback module is only required to recline a single generation of tree 210 before it finds the values of the parent messages already stored in traceback cache 704. Traceback module 618 can then construct the entirety of candidate message 816 by appending (or prepending or via some other combing technique) the values of candidate messages 810 and 812, already stored in traceback cache 714 to candidate message 816. Traceback module 618 stores the value of candidate message 816 in traceback cache 714. In embodiments, traceback cache 714 is implemented as a shift register.

Traceback module 618 may also assign a convergence score to traceback operations. For instance, in the example above, the traceback operation receives a convergence score of one because traceback module had to recurse one generation of candidate message 816 before it found a parent of candidate message 816 stored in traceback cached 704.

A convergence score of two or higher may be given to traceback operations that require recursion of more than one generation of tree 210, i.e. where the candidate message being traced back may not have an immediate parent candidate message stored in traceback cache 704. Consider, for example, generation 826. During processing of generation 826, decoder 600 may determine that candidate message 818 is the best candidate, and traceback module 618 may trace back candidate message 818 and store it (and its parent messages 816, 810, and 812) in traceback cache 704.

However, during processing of generation 828, decoder 600 may determine that candidate message 814 is the best candidate message. As shown, the parent of candidate message 814 is candidate message 820, not candidate message 818 which was determined to be the best candidate message in the previous generation. When traceback module 618 recurses tree 210, it may not find an immediate parent (i.e. candidate message 820) in traceback cache 704 because candidate message 820 was not determined to be a best candidate. Traceback module 618 may then continue recursing the tree, and may discover that candidate message 816 (the grandparent of candidate message 814) is stored in traceback cache 704. Because the traceback converged with grandparent candidate message 816 after two recursions of tree 210, traceback module 618 may assign a convergence value of two to the operation. Other schemes, such as squaring the distance, etc., can also be used to calculate and assign the convergence value.

In an embodiment, traceback module 618 may be configured to process and store more than one best candidate message from each generation in traceback cache 704. This may increase the likelihood of convergence during traceback operations. The number of best candidate messages from each generation may be one, two, four, eight, or any number as desired by design requirements.

Additionally or alternatively, traceback module 618 may store a number of generations traced-back candidate messages, depending on the size of traceback cache 704. The number of generations stored may be one, two, four, eight, or any number as desired by design requirements.

Decoder 600 may use the convergence value to dynamically or statically increase efficiency of the decoding operation. For example, decoder 600 may perform more or less sorting operations depending on the convergence value. To adjust the number of sorting operations, decoder 600 dynamically increases or decreases the search space, i.e. the number of candidate messages to be sorted. Additionally or alternatively, decoder 600 dynamically decreases the number of sorting operations so that a partial sort of the candidate messages is performed. For example, if traceback module 618 consistently assigns low convergence values to traceback operations, it may indicate that decoder 600 is performing more sorting operations than necessary to properly decode the incoming messages. Decoder 600 may then decrease the search space by sorting fewer candidate messages or performing fewer sort operations in order to, for example, increase the speed of the sorting operation and save power. Decreasing the search space may decrease the accuracy of the sorting operation. However, decreased sorting accuracy may be acceptable in certain situations (e.g. when the received wireless signal or received message has a high signal to noise ration). In such instances where the convergence value is low, decoder 600 may be able to decode incoming messages with a high degree of accuracy even if the accuracy of the sorting algorithm is decreased.

Conversely, if the convergence value is high (for example, if the wireless transmissions received by the decoder contain relatively high amounts of noise), then decoder 600 may require the sorting operation to be performed with increased accuracy. Therefore, if the convergence value assigned by traceback module 618 is high, decoder 600 may increase the search s space.

In embodiments, decoder 600 decreases the size of the search space by disabling some or all of the sorting pipeline stages (see FIG. 6), by changing the frequency of clock signals, and/or by gating power to some or all of sort module 604. Decoder 600 can also use a combination of techniques to decrease the search space. Conversely, decoder 600 increases the search space by enabling some or all of the pipeline stages, changing the frequency of clock signals, and/or by gating power to some or all of sort module 604. Decoder 600 can also use a combination of techniques to increase the search space.

In an embodiment, decoder 600 is configured to receive an external control signal to dynamically or statically adjust the size of the search space. For example, decoder 600 may receive a signal that instructs decoder 600 to turn particular pipeline stages on or off, to gate power to some or all of sort decoder 600, to change a clock frequency, to enable or disable software modules that perform the decoding operation, etc. The control signal can be an analog or digital signal, a packet, a data stream, etc. In embodiments, the control signal instructs decoder 600 specifically as to how to alter, adjust, enable, or disable pipeline stages, software modules, clocks, etc. In other embodiments, the control signal simply instructs or requests decoder 600 to increase or decrease the search space, or to increase or decrease power consumption. Upon receipt of the signal, decoder 600 then alters, adjusts, enables, or disables pipeline stages, software modules, clocks, etc. in accordance with the control signal.

During decoding operations, decoder 600 may continuously or periodically monitor the convergence value and dynamically adjust the size of the search space. Decoder 600 may also process the convergence values by, for example, maintaining a running average of convergence values. Based on the convergence value, decoder 600 may also turn other features or hardware dements on and off. For example, if the convergence value is low, it may indicate that the message being received is of high quality. In such situations, decoder 600 may turn off input filters, amplifiers, or other signal processing hardware or software elements to conserve power if they are not needed. Decoder may also, for example, discard unnecessary parts of the incoming rateless message and not process them if they are not needed. Conversely, if the convergence value is high, decoder 600 may turn such elements on to improve signal quality. In embodiments, decoder 600 is configured to statically adjust the size of the search space based on, for example, an external control signal received by decoder 600.

In embodiments, decoder 600 also uses the convergence value to predict whether decode operations will fail. For example, if the sort operating is operating with high accuracy and the convergence value remains high, it may indicate that the incoming messages cannot be properly decoded. This can occur, for example, if the incoming message has a low signal to noise ration. Decoder 600 also uses the convergence value to determine how much of the rateless incoming message needs to be decoded, and how much can be discarded. Discarding unnecessary portions of the incoming message can conserve power, time, and other resources. Decoder 600 may also provide, the convergence value to other portions or layers of a system in which decoder 600 is a part. For example, decoder 600 can provide the convergence, value to a receiver module, which can then use the convergence value to adjust its reception. As another example, decoder 600 can provide the convergence value to a communication module that can coordinate with other transceivers to adjust transmission rates—i.e. reduce transmission rate if the convergence value is high or increase transmission rate if the convergence value is low.

Figure 9:
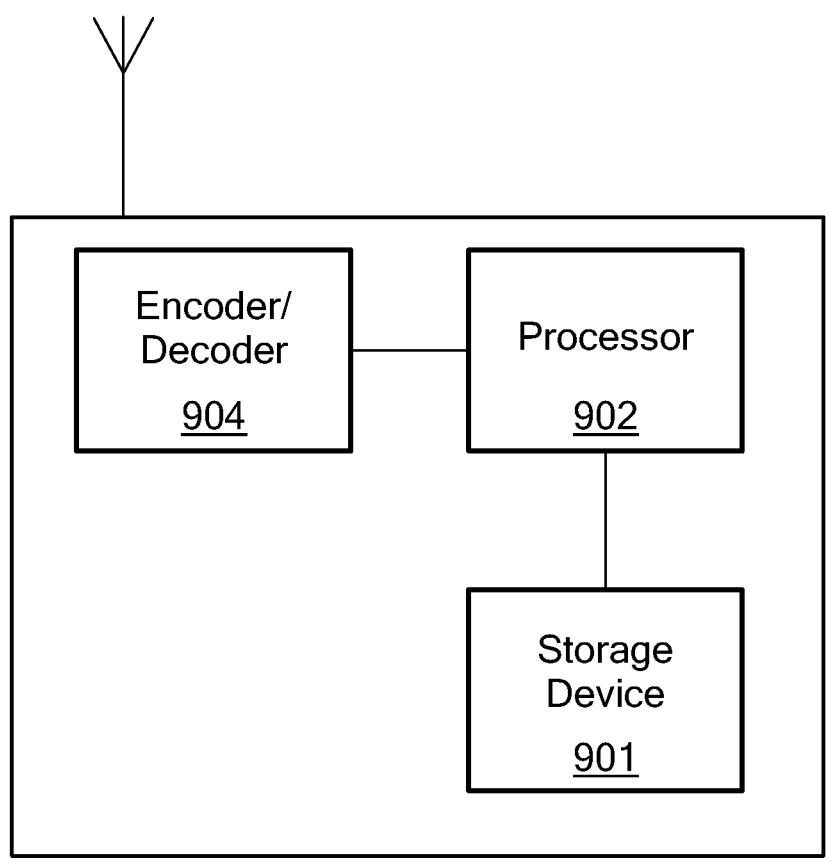
FIG. 9 is a block diagram of a computing device.

Embodiments of the technology may be implemented in hardware, software, or a combination of hardware and software. Referring to FIG. 9, a software embodiment may include software instructions stored on a computer readable storage device 900 (e.g. a RAM, ROM, hard disc, CD, DVD, Flash drive, and the like). The instructions may be source code, script code, pseudo-code, machine code, assembly code, or any other type of code that can be executed by a processor 902. When executed, the instructions may cause the processor 902 (or other hardware such as encoder/decoder 904) to perform decoding operations as described above.

The embodiments should not be limited to disclosed embodiments but rather should be limited only by the spirit and scope of the appended claims. All publications and references cited herein are expressly incorporated herein by reference in their entirety.

The invention claimed is:

1. A system for decoding messages comprising:
   a receiver capable of receiving an encoded message;
   a pipelined sorting module configured to organize candidate messages into a number of bins, sort the candidate messages within each bin, and output a group of candidate messages, the group comprising a number of most likely candidate messages from each message bin; and
   a traceback module configured to receive the most likely candidate message, and walk through a tree of candidate messages to generate a decoded message.

2. The system of claim 1 wherein the sorting module is configured to place sibling candidate messages into different bins.

3. The system of claim 1 wherein the sorting module is a pipelined sorting module having two or more pipeline stages.

4. The system of claim 3 wherein the pipeline stages can be individually enabled and disabled.

5. The system of claim 4 wherein the sorting module is configured to enable and/or disable the pipeline stages dynamically during operation.

6. The system of claim 3 wherein each pipeline stage performs a partial sort of the candidate messages.

7. The system of claim 3 wherein each of the two or more pipeline stages performs a partial sort of the candidate messages.

8. The system of claim 1 wherein the sorting module is configured to sort the candidate messages based on a computed distance between the candidate messages and the encoded message.

9. The system of claim 1 wherein the traceback module includes a traceback cache.

10. The system of claim 9 wherein the traceback module is further configured to store values of previously processed candidate messages in the traceback cache.

11. The system of claim 1 wherein the traceback module is further configured to assign a convergence score to traceback operations, wherein the convergence score is based on a number of generations between the most likely candidate message and a previously processed candidate messages stored by the traceback module.

12. The system of claim 11 wherein the sorting module is configured to adjust the size of a search space based on a value of the convergence score or based on an external control signal.

13. The system of claim 12 wherein the sorting module is further configured to adjust the size of the search space by adjusting the number of sort operations performed by the sorting module or adjusting the number of candidate messages to be sorted.

14. The system of claim 12 wherein the sorting module is further configured to adjust the size of the search space by turning pipeline stages on or off, gating power to portions of the sorting module, changing a frequency of a clock, altering software-based parameters, or a combination thereof.

15. A method for decoding a message received over a communication channel, the method comprising:
   receiving an encoded message;
   organizing a plurality of candidate messages into a number of bins in a memory;
   sorting, by a pipelined sorting module, the candidate messages within each bin;
   producing a group of candidate messages consisting of number of most likely candidate messages from each bin; and
   tracing at least one of the most likely candidate messages through a tree of candidate messages to generate a decoded message.

16. The method of claim 15 wherein organizing the plurality of candidate messages includes placing the candidate messages into α bins having up to β*2^k candidate message each, wherein β is a number representing the most likely messages from each bin, and k is the length in bits of the candidate message or a portion thereof.

17. The method of claim 16 further comprising choosing the best β messages from each bin as the most likely candidate messages, where B=αβ, and the total candidate messages per generation is B*2^k.

18. The method of claim 15 further comprising placing sibling candidate messages into separate bins.

19. The method of claim 15 wherein the sorting the candidate messages includes processing the candidate messages in a pipelined sorting module having pipeline stages.

20. The method of claim 19 wherein sorting the candidate messages include performing a partial sort of the candidate messages by processing the candidate messages with fewer than all of the pipeline stages.

21. The method of claim 15 wherein sorting the candidate messages comprises sorting the candidate messages based on a computed distance between the candidate messages and the encoded message.

22. The method of claim 21 wherein tracing includes storing values of previously processed candidate messages in a traceback cache.

23. The method of claim 15 further comprising assigning a convergence score to tracing operations based on a number of generations between the most likely candidate message and a previously processed candidate messages.

24. The method of claim 23 further comprising adjusting the size of a search space based on a value of the convergence score or an external control signal.

25. The method of claim 24 wherein adjusting the size of the search space includes adjusting the number of sort operations performed by the sorting module or adjusting the number of candidate messages to be sorted.

26. The method of claim 24 wherein adjusting the size of the search space includes turning pipeline stages on or off, gating power to portions of the sorting module, changing a frequency of a clock, or a combination thereof.

27. A system for decoding a message received over a communication channel, the system comprising:
a receiver for receiving an encoded message;
a pipelined sorting module configured to sort candidate messages to identify one or more most likely candidate messages from each message bin;
a traceback module configured to receive the most likely candidate messages and determine a convergence value based on convergence of the most likely candidate messages with previously processed most likely candidate messages.

28. The system of claim 27 further comprising a circuit to enable or disable one or more pipeline stages of the pipelined sorting module based on the convergence value.

* * * * *

UNITED STATES PATENT AND TRADEMARK OFFICE
CERTIFICATE OF CORRECTION

PATENT NO. : 9,793,944 B2
APPLICATION NO. : 14/820856
DATED : October 17, 2017
INVENTOR(S) : Kermin Elliott Fleming et al.

It is certified that error appears in the above-identified patent and that said Letters Patent is hereby corrected as shown below:

On the Title Page

Item (57), Abstract, Line 1, delete "techniques" and replace with --technique--

In the Specification

Column 2, Line 25, delete "associate" and replace with --associated--

Column 2, Line 42, delete "prior" and replace with --prior to--

Column 2, Lines 63-64, delete "message(" and replace with --message (--

Column 2, Line 67, delete "same an" and replace with --same as an--

Column 3, Line 41, delete "rate-less" and replace with --rate less--

Column 6, Line 20, delete "either be fed" and replace with --either fed--

Column 6, Lines 23, first occurrence, 25 and 35, replace all instances of "a" with --α--

Column 6, Line 44, replace "trace back" with --traceback--

Column 6, Line 60, delete "receive perform" and replace with --perform--

Column 7, Line 24, replace "recline" with --recurse--

Column 7, Line 28, replace "combing" with --combining--

Column 7, Line 39, replace "cached" with --cache--

Signed and Sealed this
Seventh Day of August, 2018

Andrei Iancu
*Director of the United States Patent and Trademark Office*

CERTIFICATE OF CORRECTION (continued)
U.S. Pat. No. 9,793,944 B2

Column 7, Line 47, replace "trace back" with --traceback--

Column 8, Line 34, replace "ration)." with --ratio).--

Column 8, Line 44, replace "search s space" with --search space--

Column 9, Line 12, replace "dements" with --elements--

Column 9, Line 31, replace "ration" with --ratio--

Column 9, Line 36, remove the "," after the word provide

Column 9, Line 39, remove the "," after the word convergence